United States Patent
Masumoto

(10) Patent No.: US 7,344,916 B2
(45) Date of Patent: Mar. 18, 2008

(54) PACKAGE FOR A SEMICONDUCTOR DEVICE

(75) Inventor: Kenji Masumoto, Hiji-machi (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/274,433

(22) Filed: Nov. 15, 2005

(65) Prior Publication Data

US 2006/0110927 A1     May 25, 2006

Related U.S. Application Data

(62) Division of application No. 10/651,522, filed on Aug. 29, 2003, now Pat. No. 6,992,380.

(51) Int. Cl.
*H01L 21/00* (2006.01)

(52) U.S. Cl. ............................. 438/106; 257/E21.499

(58) Field of Classification Search ................ 257/786; 438/106
See application file for complete search history.

(56) References Cited

U.S. PATENT DOCUMENTS

| | | | |
|---|---|---|---|
| 5,874,784 A | 2/1999 | Aoki et al. | 257/787 |
| 6,020,219 A | 2/2000 | Dudderar et al. | 438/118 |
| 6,127,724 A | 10/2000 | DiStefano | 257/675 |
| 6,232,661 B1 | 5/2001 | Amagai et al. | 257/737 |
| 6,242,815 B1* | 6/2001 | Hsu et al. | 257/786 |
| 6,265,782 B1 | 7/2001 | Yamamoto et al. | 257/783 |
| 6,720,209 B2 | 4/2004 | Igarashi et al. | 438/126 |
| 2002/0070462 A1 | 6/2002 | Fujisawa et al. | 257/780 |
| 2003/0134450 A1* | 7/2003 | Lee | 438/106 |

* cited by examiner

*Primary Examiner*—W. David Coleman
(74) *Attorney, Agent, or Firm*—Yingsheng Tung; Wade James Brady, III; Frederick J. Telecky, Jr.

(57) ABSTRACT

A semiconductor device 39. The device includes an interposer 31 having two major surfaces. The first surface 311 includes patterned metal conductors and bond pads 351, and the second surface includes an array of solder balls 33. The device includes a semiconductor chip 30 having a top surface and a back surface, the back surface of the chip adjacent the interposer 31, and the top surface including a plurality of terminals. Also included is a layer of polymeric material 34 disposed on the first surface 311 of the interposer covering the area of the interposer over the solder ball array. At least a portion of the polymeric layer is between the chip 30 and the interposer 31. The device further includes a plurality of electrical connections 35 between the chip terminals and the bond pads 351 on the interposer.

18 Claims, 3 Drawing Sheets

PACKAGE FOR A SEMICONDUCTOR DEVICE

This is a divisional application of application Ser. No. 10/651,522 filed Aug. 29, 2003, now U.S. Pat. No. 6,992,380 the contents of which are herein incorporated by reference in its entirety.

FIELD OF THE INVENTION

The present invention relates to semiconductor packaging and more specifically to a device having an array of solder ball contacts and method of fabrication.

BACKGROUND OF THE INVENTION

The demand for reduction in size and an increase in density of electronic components has driven the industry to produce smaller and more complex integrated circuits (IC). These trends have also forced the development of IC packages having smaller footprints, higher lead counts, and better electrical and thermal performance. At the same time, these IC packages are required to meet accepted industry standards both for reliability and in form factors acceptable to the end user. Automated pick and place equipment of the end user requires robust standardized package form factors, such as that of molded plastic packages which have been familiar to the industry.

In response to these issues the semiconductor industry has developed a number of different packages having an integrated circuit electrically connected to one surface of a substrate and an array of solder balls protruding from the opposite major surface of the substrate. In the broadest sense, the packages are referred to as ball grid array (BGA) packages. The solder balls provide mechanical and electrical interconnection to the printed circuit board (PCB) or other form of external circuitry. Generally, the packages have a relatively small footprint due to contacts under the package rather than having leads extending from the package sides, and have lower inductance as a result of the wide, short ball contacts.

One type of BGA package makes use of a somewhat rigid laminate substrate which is not unlike the materials and conductors used in PCB technology. Often these package substrates have multiple dielectric and conductor layers and have been used with large chip sizes and high pin count devices, but have found limited wide spread acceptance because the low interconnection density on the substrate results in a larger than desired package size.

Another solder ball connected package is a chip scale package (CSP) wherein the footprint of the package is no more than 20 percent greater than the chip size. This type of device frequently includes photopatterned interconnections on a flexible dielectric film interposer which in turn allows a smaller package footprint. However, because chip sizes have decreased and the number of input/output connections has increased, these packages are limited in application to low pin count circuits. Moreover, because the footprint of the solder ball contacts and the package size are directly associated with the chip, standardization which is so important to the industry is not possible.

A near CSP device, shown in FIG. 1, includes a flexible tape interposer 11 with a semiconductor chip 10 having bond wires 15 connected to the first surface 111 of the interposer 11 and solder balls 13 attached to the second surface 112 of the interposer 11. The back side of the chip is attached to the interposer by a chip attach adhesive 14 equal to or slightly larger in area than that of the chip. A molded thermosetting polymer 12 encapsulates the chip 10, wire bonds 15, and top surface 111 of the interposer.

This over molded tape carrier package (TCP) satisfies the need for low cost assembly, high density patterned interconnections on the interposer, and a molded body which can meet industry standards. Further, this package allows for a variety of different chip sizes within the same package form factor. However, the device has suffered from less than optimum solder joint reliability which has restricted its temperature cycling capability. Solder connections in close proximity to both the rigid, low thermal expansion silicon chip 10 and the higher expansion plastic molded body 12 are subject to cracks 213 or intermittent failures after soldering the package 12 to a relatively high expansion printed circuit board 26, as shown in FIG. 2. As the PCB 26 goes through thermal excursions, high levels of stress are placed on the solder joints in close proximity to the chip edges 210, and in turn, the stresses may result in cracks 213 at the solder ball interfaces to PCB or interposer. The relatively thin interposer 211, typically in the range of 25 to 150 microns thick, offers little buffering from thermally induced stresses or from impact initiated mechanical stresses. Solder joints completely under the chip or those completely under the molded plastic body are subject to less stress as a result of PCB thermal excursions than those near the chip edges where multiple stresses are concentrated.

Thermal and mechanical stresses in semiconductor packages have been the subject of studies for years, and manufacturers consider the interactions of thickness, elastic modulus, and thermal expansion of dissimilar materials against manufacturing and other trade-offs in an attempt to avoid damage to components, particularly interfaces which are brittle and/or have low strength.

There is a need in the industry for a robust, reliable small outline package having low inductance as offered by solder ball contacts, a manufacturing technology compatible with high volume and low cost processing, and a user friendly package outline. However, it is also desirable that the package be able to meet reliability and testing needs over the full range of environmental conditions as established by the industry.

SUMMARY OF THE INVENTION

A first embodiment of the invention is a semiconductor device. The device includes an interposer having two major surfaces. The first surface includes patterned metal conductors and bond pads, and the second surface includes an array of solder balls. The device includes a semiconductor chip having a top surface and a back surface, the back surface of the chip adjacent the interposer, and the top surface including a plurality of terminals. Also included is a layer of polymeric material disposed on the first surface of the interposer covering the area of the interposer over the solder ball array, at least a portion of the polymeric material layer is between the chip and the interposer. The device further includes a plurality of electrical connections between the chip terminals and the bond pads on the interposer.

Another embodiment of the invention is also a semiconductor device. The device includes an interposer having first and second major surfaces, wherein the first major surface includes patterned metal conductors and bond pads and the second major surface includes an array of solder balls connected to selected pads on the first surface. The device also includes a semiconductor chip having top and back surfaces and has an area smaller than the area of the solder ball array. The back surface of the chip is adhered to the first major surface of the interposer, and the top surface of the chip includes a plurality of terminals located on the top surface. The device further includes a plurality of polymeric structures disposed on the first major surface of the interposer, each of the polymeric structures occurs over a solder ball location in the array of solder balls. The device further includes a plurality of electrical connections between the chip terminals and the bond pads on the interposer.

Still another embodiment of the invention is a method for fabricating a semiconductor device. The method includes the steps of providing an interposer having first and second surfaces, the first surface including patterned metal conductors and bond pads, and the second surface including a plurality of solder balls; disposing on the first surface of the interposer a layer of polymeric material having an area sufficient to cover the plurality of solder balls; providing a semiconductor chip having a top surface and a back surface, the top surface including a plurality of terminals; mounting the chip on the polymeric material; and connecting the bond pads on the interposer to the terminals on the chip.

An advantage of the invention is this it helps mitigates stresses induced by differences in thermal coefficients of expansion, particularly at locations in a semiconductor chip package where a chip edge occurs over one or more solder balls.

DETAILED DESCRIPTION OF THE PREFERRED EMBODIMENTS

Figure 1:
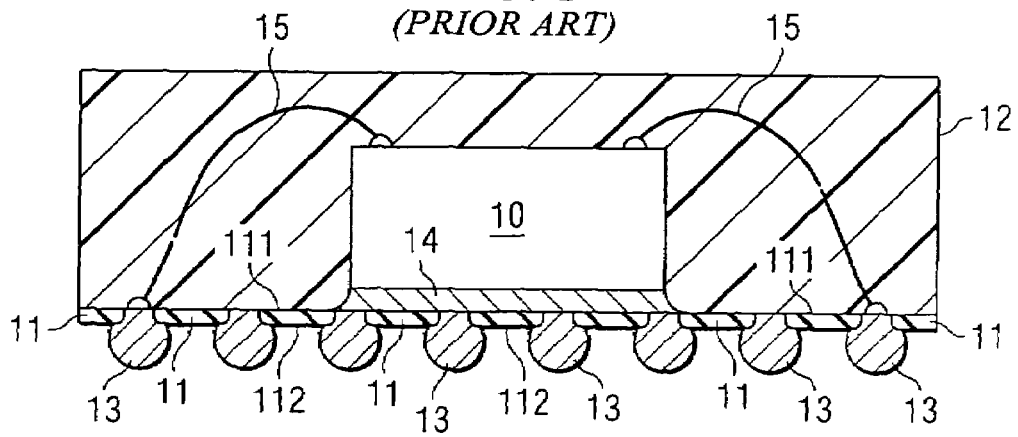
FIG. 1 is a cross sectional view of a plastic encapsulated prior art package having solder ball external contacts.
Figure 2:
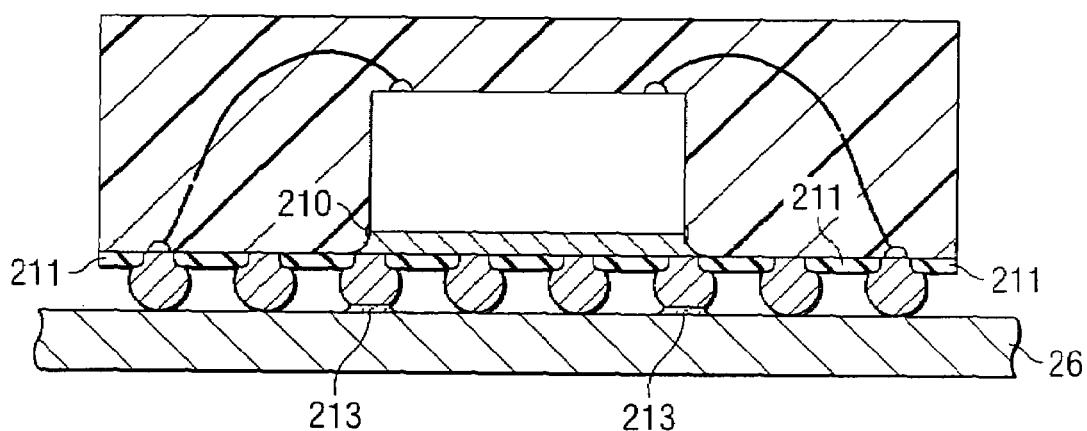
FIG. 2 illustrates a prior art semiconductor package attached to a printed circuit board and the points of high stress concentration on solder joints.
Figure 3A:
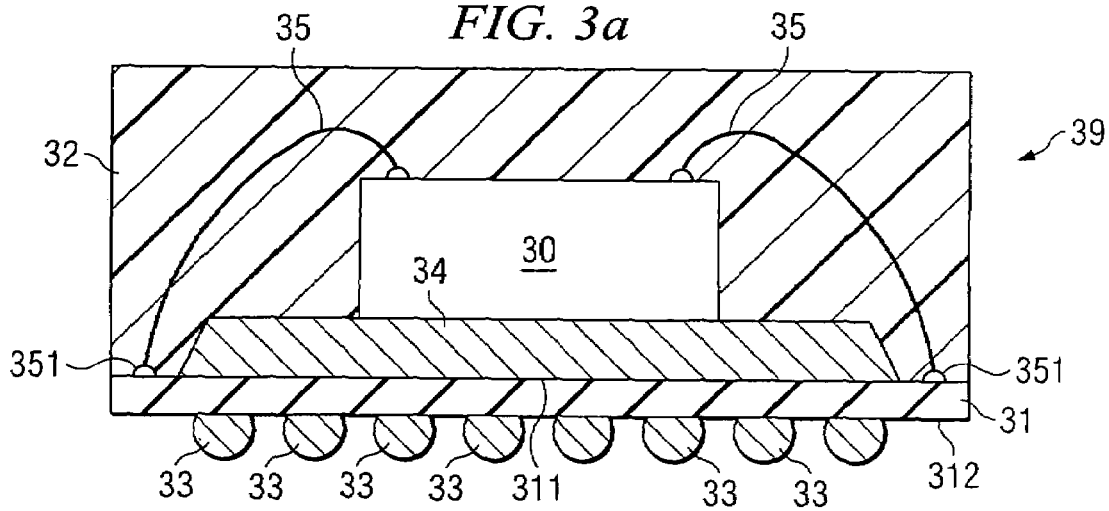
FIG. 3a is a cross sectional view of the device having a relatively thick layer of a polymeric material covering the area of solder balls.

FIG. 3a provides a cross sectional view of a first embodiment of the invention, a packaged semiconductor device 39 having improved solder joint reliability. The device 39 includes an interposer 31, an array of solder balls 33 on the second surface 312 of the interposer, a semiconductor chip 30 adhered to the first surface 311 by a relatively thick layer of polymeric material 34 and interconnected to bond pads 351 on the first surface 311 of the interposer by bond wires 35. The chip 30, interconnections 35, and first surface 311 of the interposer are encapsulated in a molded plastic 32 to form the package body.

Within a specific package configuration, including the body size and solder ball arrangement, the device 39 can accomodate different chip sizes, but in each device the area of the chip 30 is smaller than that of the array of solder balls 33 and the interposer 31. Solder balls 33 may be in a fully populated array across the interposer, including the area directly under the chip 30 and chip edges. Heretofore, efforts have been made to avoid placing solder balls under the chip edges where thermally induced stress concentrations are greatest.

In one embodiment, the interposer 31 is a flexible film having patterned metal conductors and bond pads 351 on the first surface 311 with connections (through vias for example) to selected solder balls 33 on the second surface 312. In alternative embodiments, the interposer 31 comprises a laminate or composite material which is relatively thin with respect to the chip 30 and package body 32 thickness, and which may be distorted by thermal excursions of thicker components.

Figure 3B:
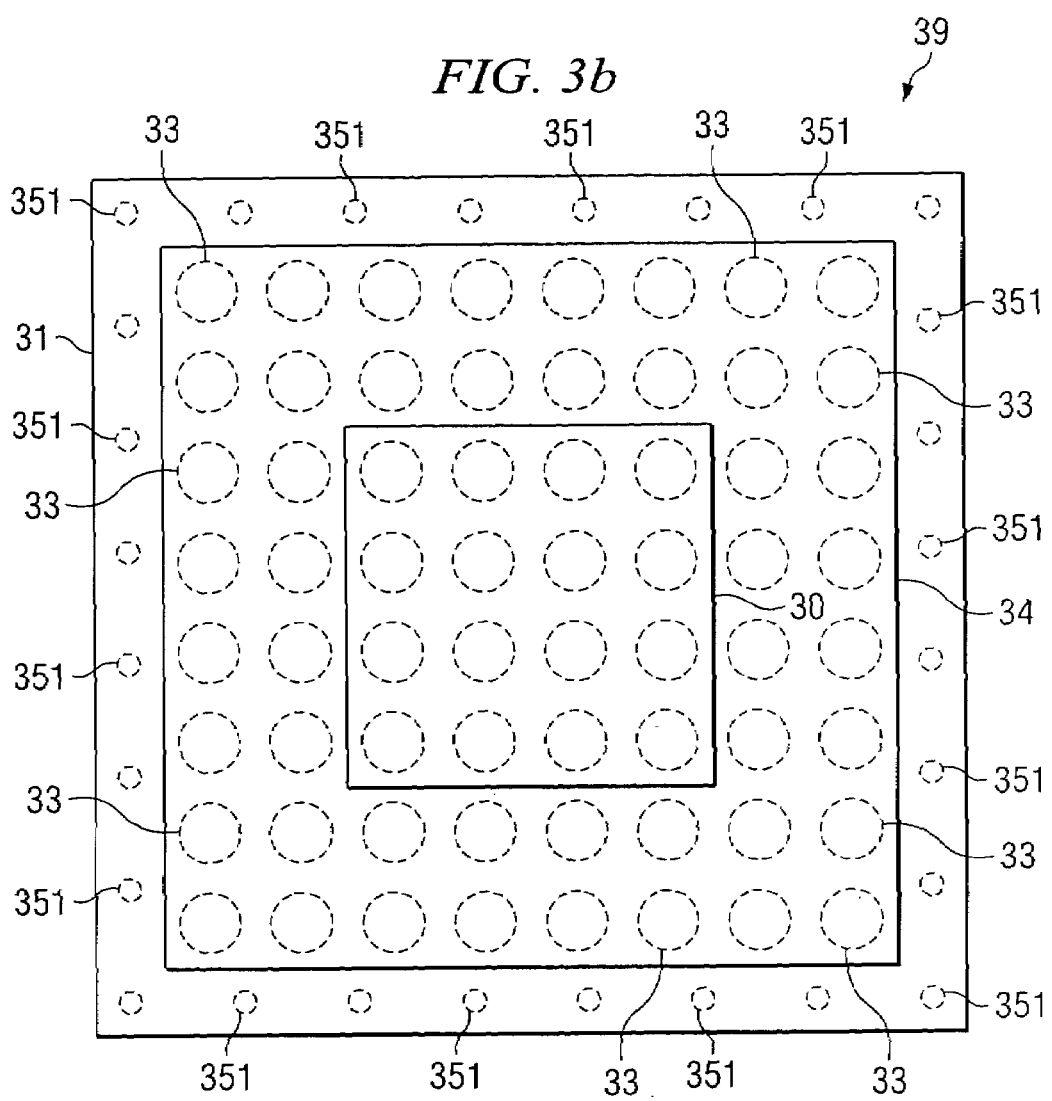
FIG. 3b illustrates the area of thick polymeric material on the interposer from a top view.

The thick layer of polymeric material 34 (a chip attach adhesive, for example), in the range of about 75 to about 200 microns in thickness, covers not only the area under the chip 30, but in the preferred embodiment extends as a continuous layer over the complete area over the solder ball array. In FIG. 3b, from a top view, the area covered by the polymeric material 34 is denoted by hatch marks and may be compared to the area defined by the underlying array of solder balls 33, to the interposer 31, and to the chip 30. The area of chip 30 is smaller than the area of the solder ball array and the interposer.

The joints of solder balls 33 to the interposer 31, as well as those which will be attached to a PCB (not shown), are protected from high concentrations of thermally and mechanically induced stresses by the thick layer of polymeric material 34 adhered to the first surface 311 of the interposer. The stresses at solder balls 333, those balls under or near the edges of the chip 30, are particularly mitigated.

The polymeric material 34 having an elastic modulus in the range of about 1 to about 15 GPa is preferably thermally conductive thermosetting adhesive, such as a compound of an epoxy resin filled with an inorganic particulate material. Thermal conductivity of the polymeric material is enhanced by the addition of particulate fillers, such as alumina. The polymeric compound may be in the form of a paste, or may be a film of a "B" staged epoxy resin.

The polymeric material 34 is applied to the interposer 31, completely covering the area of the array of solder balls 33 on the opposite side of the interposer. The chip 30 is aligned and placed on the interposer 31, and the assemblage subjected to a thermal or other process to solidify the polymer and adhere the chip.

Preferably, electrical connection between the chip 30 and bond pads 351 is made by gold bond wires 35. However, the device is not limited to wire bonding, but TAB or other conductive tape interconnections are applicable. The chip 30, bond wires 35, and first surface of the interposer 311 are encapsulated by molding in a thermosetting polymeric compound 32 to form the package body. Solder balls 33 are aligned to the second surface of the interposer and electrically and mechanically connected by a solder reflow process.

Figure 4:
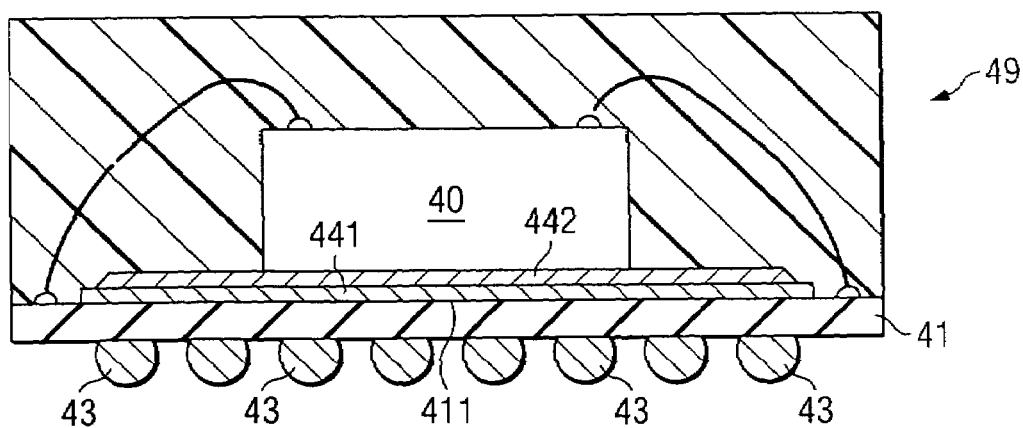
FIG. 4 is a cross sectional view of the device having two layers of polymeric material covering the perimeter defined by the solder ball array.

In another embodiment, as illustrated in FIG. 4 the device 49 includes two or more layers 441,442 of polymeric material which covers the area of the interposer 41 over the array of solder balls 43. Preferably, a thermally conductive, electrically insulating layer 441 is placed in direct contact with the first surface 411 of the interposer 41 to cover patterned interconnections and prevent shorting. A metal filled, electrically, as well as thermally conductive, polymeric adhesive 442 is superimposed on the first layer 441. The first electrically insulating layer 441 may be a preformed film of polymeric material, slightly larger in area than the array of solder balls 43 on the opposite side of the interposer. The top layer 442, preferably of a metal filled polymer, provides improved thermal conductivity and heat spreading across the package, as compared to most insulating polymeric compounds.

Figure 5A:
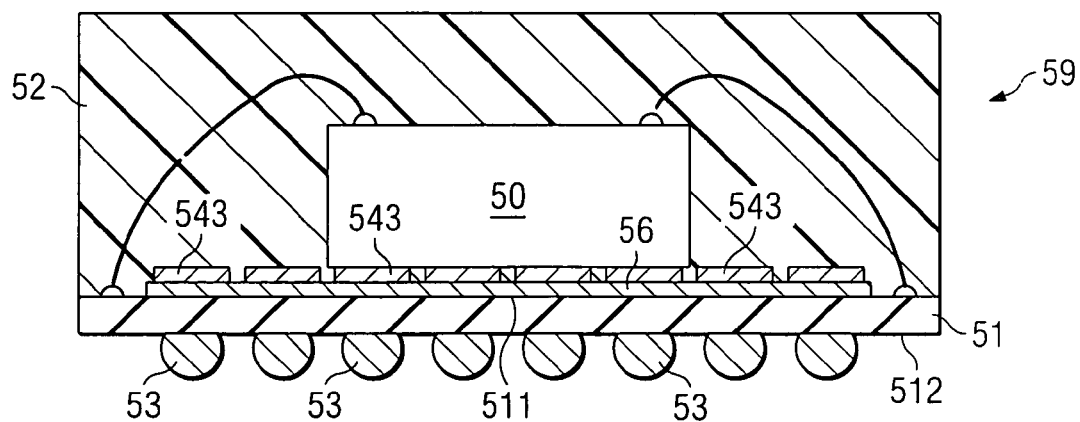
FIG. 5a is a cross sectional view of the device having preformed polymeric material on the upper surface of the interposer atop each solder ball pad.

Another embodiment of the device 59 having reliable solder joints, shown in FIG. 5*a*, includes an interposer 51 having an array of solder balls 53 on the second surface 512, and a semiconductor chip 50 attached to the first surface 511. A plurality of individual polymeric structures 543, chip attach adhesive for example, are positioned over and encompass the area of each solder ball 53 on the opposite side of the interposer 51. The structures, about 75 to about 200 microns in thickness, comprise a polymeric compound having an elastic modulus in the range of about 1 to about 15 GPa.

Figure 5B:
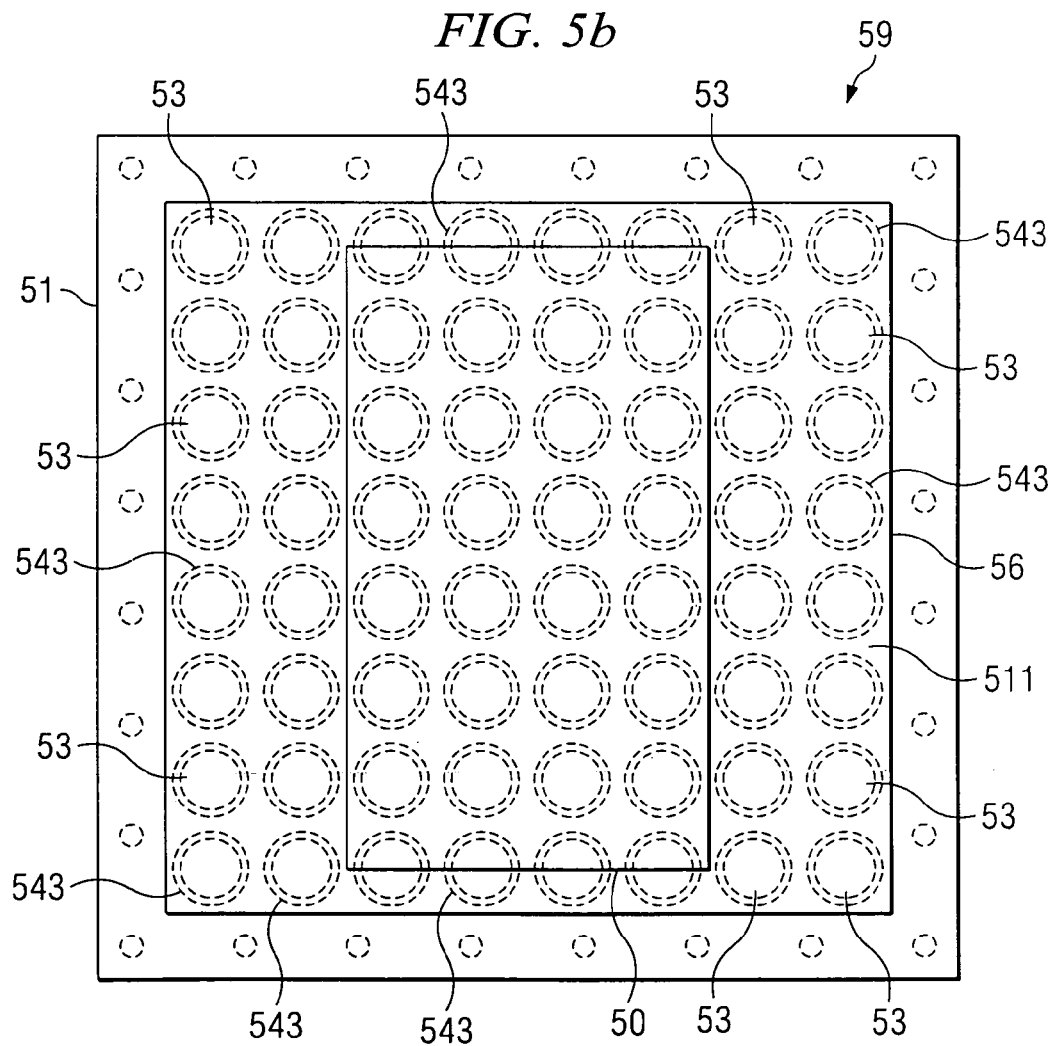
FIG. 5b is a top view of the package having polymeric structures encompassing the area of solder balls.

The plurality of polymeric structures 543 mirroring the array of solder balls 53 may be disposed directly on the first interposer surface 511, as shown from the top view in FIG. 5*b*, or may be preformed on an insulating adhesive film 56 as shown in FIG. 5*a*. The thick polymeric structures 543 mitigate thermally induced stress on solder joints by decoupling the solder balls 53 from the rigid semiconductor chip 50, from the molded package body 52, and from the printed circuit board to which the package will subsequently be attached. The optional thin layer of insulating film 56 sized to cover the area of solder balls 53 serves not only to support an array of preformed polymeric structures 543, but may also isolate the structures from conductors on the interposer surface 511, thereby allowing the adhesive structures 543 to comprise either an electrically insulating or conductive polymeric compound.

In each embodiment of the package described herein, the area of the chip 30 may differ within a given package size, but it is consistently smaller than that of the solder ball array and interposer. Solder balls may be arrayed across the bottom of the interposer, including the area directly under the chip edges.

It will be recognized that modifications and variations in the design and method for making the semiconductor package having improved solder joint reliability will become apparent to those skilled in the art. Therefore, it is intended that the claims be interpreted as broadly as possible.

What is claimed is:

1. A method for fabricating a semiconductor device, comprising the steps of:
   providing an interposer having first and second surfaces, said first surface including patterned metal conductors and bond pads, and said second surface including a plurality of solder balls;
   disposing on said first surface of said interposer a layer of polymeric material having an area sufficient to cover said plurality of solder balls;
   the layer of polymeric material including a first layer of a thermally conductive, electrically insulating layer contacting the interposer; and a second metal filled, electrically and thermally conductive polymeric adhesive layer superimposed on the first layer;
   providing a semiconductor chip having a top surface and a back surface, said top surface including a plurality of terminals;
   mounting said chip on said polymeric material; and
   connecting said bond pads on said interposer to said terminals on said chip.

2. The method of claim 1 wherein said step of disposing a layer of polymeric material comprises disposing a layer of polymeric material having thickness in the range of about 75 microns to about 200 microns.

3. The method of claim 1 wherein providing an interposer includes providing a flexible film.

4. The method of claim 1 wherein providing an interposer includes providing a thin laminate.

5. The method of claim 1 wherein providing an interposer includes providing a thin composite material.

6. The method of claim 1 wherein disposing a layer of polymeric material includes disposing a layer of polymeric material with an elastic modulus in the range of about 1 to 15 GPa.

7. The method of claim 1 wherein disposing a layer of polymeric material includes disposing a layer of thermosetting polymeric material.

8. The method of claim 1 wherein disposing a layer of polymeric material includes performing the polymeric material.

9. The method of claim 1 wherein disposing a layer of polymeric material includes disposing a layer of insulator layer adjacent the interposer, and a metal filled polymeric layer on the insulator layer.

10. A method for fabricating a semiconductor device, comprising the steps of:
    providing an interposer having first and second surfaces, said first surface including patterned metal conductors and bond pads, and said second surface including a plurality of solder balls;
    disposing on said first surface of said interposer a layer of polymeric material having an area sufficient to cover said plurality of solder balls;
    the layer of polymeric material including a plurality of individual polymeric structures positioned over and encompass the area of each solder ball on the opposite side of the interposer;
    providing a semiconductor chip having a top surface and a back surface, said top surface including a plurality of terminals;
    mounting said chip on said polymeric material; and
    connecting said bond pads on said interposer to said terminals on said chip.

11. The method of claim 10 wherein said step of disposing a layer of polymeric material comprises disposing a layer of polymeric material having thickness in the range of about 75 microns to about 200 microns.

12. The method of claim 10 wherein providing an interposer includes providing a flexible film.

13. The method of claim 10 wherein providing an interposer includes providing a thin laminate.

14. The method of claim 10 wherein providing an interposer includes providing a thin composite material.

15. The method of claim 10 wherein disposing a layer of polymeric material includes disposing a layer of polymeric material with an elastic modulus in the range of about 1 to 15 GPa.

16. The method of claim 10 wherein disposing a layer of polymeric material includes disposing a layer of thermosetting polymeric material.

17. The method of claim 10 wherein disposing a layer of polymeric material includes performing the polymeric material.

18. The method of claim 10 wherein disposing a layer of polymeric material includes disposing a layer of insulator layer adjacent the interposer, and a metal filled polymeric layer on the insulator layer.

* * * * *